(12) United States Patent
Smith et al.

(10) Patent No.: US 11,824,527 B2
(45) Date of Patent: Nov. 21, 2023

(54) ELECTRIC CIRCUITRY FOR SIGNAL TRANSMISSION

(71) Applicant: ams AG, Premstätten (AT)

(72) Inventors: Jeffrey Smith, Eindhoven (NL); Pawel Chojecki, Eindhoven (NL)

(73) Assignee: AMS AG, Premstätten (AT)

( * ) Notice: Subject to any disclaimer, the term of this patent is extended or adjusted under 35 U.S.C. 154(b) by 0 days.

(21) Appl. No.: 17/763,333

(22) PCT Filed: Aug. 14, 2020

(86) PCT No.: PCT/EP2020/072864
§ 371 (c)(1),
(2) Date: Mar. 24, 2022

(87) PCT Pub. No.: WO2021/058196
PCT Pub. Date: Apr. 1, 2021

(65) Prior Publication Data
US 2022/0337242 A1    Oct. 20, 2022

(30) Foreign Application Priority Data
Sep. 26, 2019  (EP) .................................... 19199856

(51) Int. Cl.
*H03K 17/687* (2006.01)
*H03K 17/06* (2006.01)
*H03K 17/94* (2006.01)

(52) U.S. Cl.
CPC ....... *H03K 17/6871* (2013.01); *H03K 17/063* (2013.01); *H03K 17/94* (2013.01); *H03K 2217/0054* (2013.01)

(58) Field of Classification Search
CPC .. H03K 17/6871; H03K 17/063; H03K 17/94; H03K 2217/0054
See application file for complete search history.

(56) References Cited

U.S. PATENT DOCUMENTS 5,920,233 A * 7/1999 Denny .................... H03L 7/093
331/25
2010/0134181 A1    6/2010 Kinsella
(Continued)

FOREIGN PATENT DOCUMENTS

CN          108199701 A       6/2018

OTHER PUBLICATIONS

Extended European Search Report in corresponding EP Application No. 19199856.6 dated Mar. 12, 2020, 10 pages.
(Continued)

*Primary Examiner* — Metasebia T Retebo
(74) *Attorney, Agent, or Firm* — MH2 TECHNOLOGY LAW GROUP LLP

(57) ABSTRACT

An electric circuitry for signal transmission comprises a transmission gate having an input node to apply an input signal. The transmission gate includes a first transistor having an electric conductive channel of a first type of conductivity and a second transistor having an electric conductive channel of a second type of conductivity. The electric circuitry comprises a control circuit to control the signal transmission of the transmission gate. The control circuit is configured to generate a first and second control signal to control the conductivity of the first and second transistor in dependence on a voltage level of the input signal.

11 Claims, 4 Drawing Sheets

(56) References Cited

U.S. PATENT DOCUMENTS

| | | |
|---|---|---|
| 2011/0193615 A1 | 8/2011 | Ono |
| 2012/0056660 A1 | 3/2012 | Yamada et al. |
| 2013/0249621 A1* | 9/2013 | Gagne .................. H03K 17/063 |
| | | 327/408 |
| 2015/0171861 A1* | 6/2015 | Aherne .............. H03K 17/6872 |
| | | 327/437 |

OTHER PUBLICATIONS

International Search Report and Written Opinion in corresponding International Application No. PCT/EP2020/072864 dated Oct. 15, 2020, 14 pages.

* cited by examiner

ELECTRIC CIRCUITRY FOR SIGNAL TRANSMISSION

CROSS-REFERENCE TO RELATED APPLICATIONS

The present application is the national stage entry of International Patent Application No. PCT/EP2020/072864, filed on Aug. 14, 2020, and published as WO 2021/058196 A1 on Apr. 1, 2021, which claims the benefit of priority of European Patent Application No. 19199856.6, filed on Sep. 26, 2019, all of which are incorporated by reference herein in their entireties.

TECHNICAL FIELD

The disclosure relates to an electric circuitry for signal transmission comprising a transmission gate that can be operated in a conductive or nearly non-conductive state.

BACKGROUND

A transmission gate is usually provided in an electric circuit to transmit a signal between components of the circuit or between other electronic devices. FIG. 1 shows an embodiment of a conventional transmission gate 100 comprising a first transistor 110 and a second transistor 120 being connected in parallel between nodes A and B. Each of the nodes A and B may be configured as an input node to apply an input signal or an output node to provide an output signal in response to the applied input signal after transmission through the transmission gate.

According to the embodiment of the transmission gate shown in FIG. 1, the first transistor 110 and the second transistor 120 are configured as field-effect transistors, wherein the respective drain terminals and the respective source terminals of the two transistors are connected together. The gate terminal of the first transistor 110 is configured as a control terminal C110 to apply a control signal CS1, and the gate terminal of the second transistor 120 is configured as a control terminal C120 to apply a control signal CS2. The control signal CS2 is usually inverted in relation to the control signal CS1.

FIG. 1B shows an equivalent circuit of the transmission gate 100 illustrated in FIG. 1A. As shown in FIG. 1B, the first transistor 110 can be modeled by a controllable switch 111 and a resistor 112 having a variable resistance. The controllable switch 111 and the resistor 112 are connected in series. In the same way, the electric characteristics of the second transistor 120 correspond to a controllable switch 121 being connected in series to a resistor 122 having a variable resistance.

The function of the transmission gate 100 is briefly explained in the following. When the control signal CS1 is logic 0 and thus has a negative voltage potential, the control terminal C110 of the first transistor 110, for example the gate of the n-channel MOSFET, also has a negative voltage potential. Due to the inversion of the control signals, the control signal CS2 at the control terminal C120 of the second transistor 120 has the positive voltage potential. Regardless of which switching terminal A or B of the transmission gate 100 a voltage is applied on, the gate-source voltage of the first transistor 110, in the example the n-channel MOSFET, is always negative, and the gate-source voltage of the second transistor 120, in the example the p-channel MOSFET, is always positive. Accordingly, neither of the two transistors will conduct and the transmission gate turns off.

When the control signal CS1 is a logic 1, and thus has a positive voltage potential, the control terminal C110 of the first transistor is driven by a positive voltage potential. Consequently, the control signal CS2 at the control terminal C120 of the second transistor 120 is a logic 0 and thus has a negative voltage potential. As a result, the transistors 110 and 120 are operated in a conductive state.

FIG. 2 shows a resistance characteristic of the transmission gate 100, when an input signal/voltage at one of the nodes A or B is raised from a negative power supply potential $V_{SS}$ to a positive power supply potential $V_{DD}$. Assuming that the first transistor 110 is embodied as an n-channel MOSFET and the second transistor 120 is embodied as a p-channel transistor, the voltage value $V_{THN}$ denotes the threshold voltage of the first transistor 110 and the voltage value $V_{THP}$ denotes the threshold voltage of the second transistor 120.

If one of the terminals A or B of the transmission gate 100 is raised to a voltage near the negative supply voltage $V_{SS}$, a positive gate-source voltage/gate-drain voltage will occur at the first transistor 110. As a consequence, the first transistor 110 begins to conduct, and, thus, the transmission gate 100 is operated in a conductive state. If the voltage at one of the terminals A or B of the transmission gate is now raised continuously up to the positive supply voltage potential $V_{DD}$, the gate-source voltage/gate-drain voltage of the first transistor 110 is reduced, and the variable resistance of the channel of the first transistor 110 increases. At the same time, a negative gate-source voltage/gate-drain voltage builds up at the second transistor 120, in the example the p-channel MOSFET, whereby the second transistor 120 starts to conduct.

In conclusion, it is achieved that the transmission gate is operated in a conductive state over the entire voltage range from the negative power supply potential $V_{SS}$ to the positive power supply potential $V_{DD}$.

As illustrated in FIG. 2, the transmission resistance $r_{on}$ of the transmission gate varies depending upon the input voltage applied at one of the terminals A or B. In particular, the resistance $r_{on}$ of the transmission gate 100 shown in FIG. 2 is a combination of the on-resistance of the first transistor 110, for example the n-channel MOSFET, and the on-resistance of the second transistor 120, for example the p-channel MOSFET, of the transmission gate. As the common mode input voltage $V_{IN}$ changes between the negative power supply potential $V_{SS}$ to the positive power supply potential $V_{DD}$ the resistance $r_{on}$ of the transmission gate varies as shown in FIG. 2.

FIG. 3 shows a circuit configuration, wherein an input signal swing V1 is applied via a resistor R1 to the transmission gate 100. When the transmission gate 100 is connected to a fixed load impedance R2, as shown in FIG. 3, the voltage-dependent variation in resistance $r_{on}$ of the transmission gate 100 causes the transmission gate to behave like a variable potential divider with a load impedance. This results in a voltage-dependent transfer function which introduces distortion to the output signal V2.

The distortion characteristic of the transfer function of the transmission gate 100 is shown in FIG. 4. The distortion characteristic of the transfer function has two peaks which correspond to the input voltage $V_{IN}$ applied to terminal A or B at which the individual transistors 110, 120 of the transmission gate are toggling between cut-off and linear operation. At these points the absolute resistance $r_{on}$ of the transmission gate is dominated by the transistor in linear operation, but the change in resistance $r_{on}$ is dominated by the other transistor toggling between cut-off and linear operation.

It is desired to provide an electric circuitry for signal transmission, wherein a transfer function of a transmission gate of the electric circuitry shows an improved distortion characteristic.

SUMMARY

An embodiment of an electric circuitry for signal transmission which provides a reduced distortion of an output signal of a transmission gate is specified in claim 1.

The electric circuitry for signal transmission comprises a transmission gate having an input node to apply an input signal and an output node to provide an output signal. The electric circuitry further comprises a control circuit to control a signal transmission of the transmission gate between the input node and the output node. The transmission gate includes a first transistor having an electric conductive channel of a first type of conductivity and a second transistor having an electric conductive channel of a second type of conductivity.

The first transistor has a control terminal to apply a first control signal to control the conductivity of the electric conductive channel of the first transistor. The second transistor has a control terminal to apply a second control signal to control the conductivity of the electric conductive channel of the second transistor. The control circuit is configured to generate the first and second control signal in dependence on a voltage level of the input signal to control the conductivity of the first and second transistor.

The electric circuitry may comprise an evaluation circuit to evaluate a level of the input signal. In particular, the input signal of the transmission gate is compared by the evaluation circuit with two reference voltages derived from the threshold voltages of the first and second transistor. When the transmission gate input signal swing is detected crossing one of the voltage references, the control circuit generates the first and second control signal to switch off either the first transistor or the second transistor of the transmission gate.

The separate control of the first and second transistor of the transmission gate enables optimization of the operation of the transmission gate in response to the input signal conditions to reduce the distortion of the signal transferred by the transmission gate when the transmission gate is connected to a finite load impedance.

According to a possible embodiment of the electric circuitry a hold function may be implemented to ensure that the respective state of the first and second control signals applied to the respective control terminals of the first and second transistors of the transmission gate is not changed due to instantaneous changes of the input signal, i.e. an input signal swing above and below the first or second threshold value.

DETAILED DESCRIPTION

Figure 5:
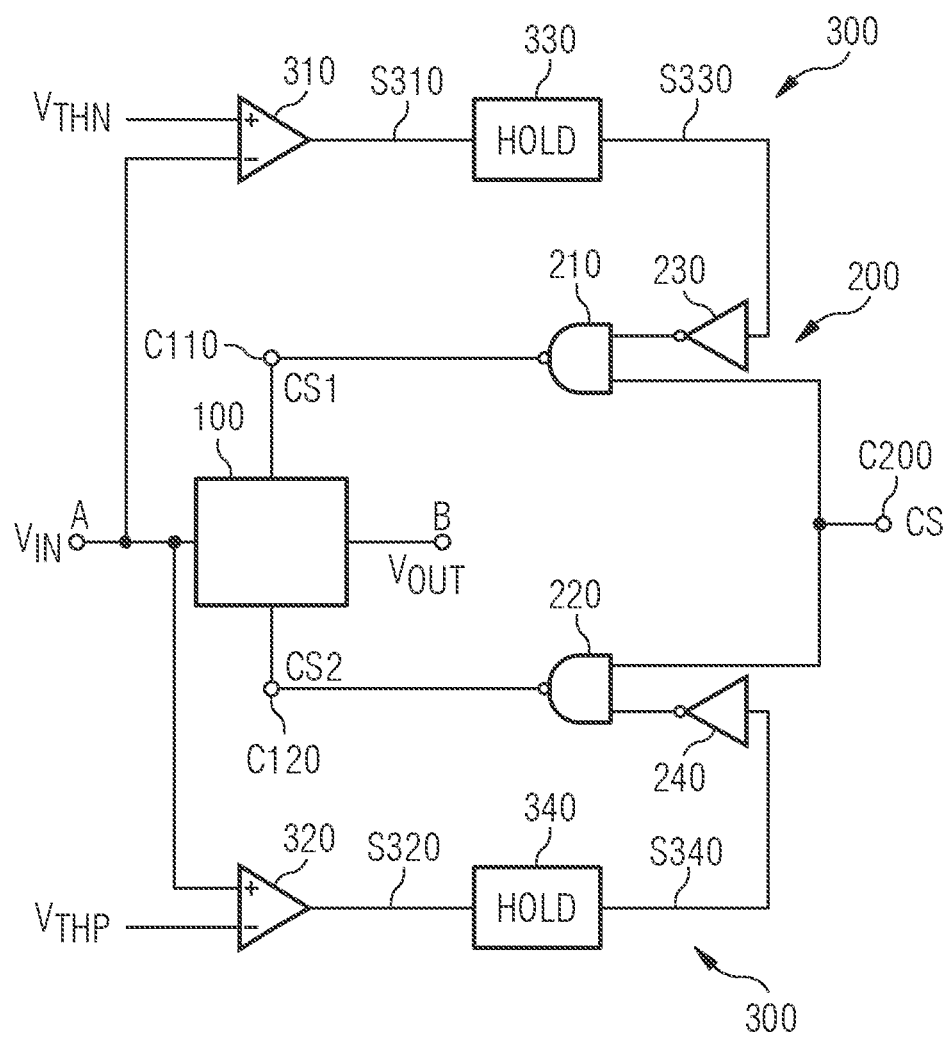
FIG. 5 shows an embodiment of an electric circuitry for signal transmission having an improved distortion characteristic of the transfer function of a transmission gate of the electric circuitry.

FIG. 5 shows an embodiment of an electric circuitry 10 which allows to transfer an input signal $V_{IN}$ from one of the nodes A or B to the other one of the nodes A, B. For the following explanation, it is assumed that the input signal $V_{IN}$ is transmitted from node A being configured as an input node, to node B being configured as an output node. However, the reverse signal propagation path, i.e. the transmission from an input signal from node B to node A, is also possible by using the electric circuitry shown in FIG. 5.

The electric circuitry 10 comprises a transmission gate 100 having the input node A to apply the input signal $V_{IN}$ and the output node B to provide an output signal $V_{OUT}$. The electric circuitry further comprises a control circuit 200 to control a signal transmission of the transmission gate 100 between the input node A and the output node B. The transmission gate 100 includes a first transistor 110 having an electric conductive channel of a first type of conductivity and a second transistor 12(0 having an electric conductive channel of a second type of conductivity.

According to the exemplary embodiment of the electric circuitry 10 shown in FIG. 5, the electric conductive channel of the first transistor 110 may have a conductivity of an n-type. In particular, the first transistor 110 may be configured as an n-channel MOSFET. The electric conductive channel of the second transistor 120 may have a conductivity of a p-type. In particular, the second transistor 120 may be connecting component as a p-channel MOSFET.

The first transistor 110 has a control terminal C110 to apply a first control signal CS1 to control the conductivity of the electric conductive channel of the first transistor 110. The second transistor 120 has a control terminal C120 to apply a second control signal CS2 to control the conductivity of the electric conductive channel of the second transistor 120. The control circuit 200 is configured to generate the first and second control signals CS1 and CS2 in dependence on a voltage level of the input signal $V_{IN}$ to control the conductivity of the first and second transistors 110 and 120.

The electric circuitry 10 comprises an evaluation circuit 300 to evaluate a level of the input signal $V_{IN}$. The evaluation circuit 300 is configured to evaluate whether the level of the input signal $V_{IN}$ exceeds a first threshold value $V_{THN}$ and a second threshold value $V_{THP}$. The first threshold value $V_{THN}$ corresponds to a threshold voltage of the first transistor 110, and the second threshold value $V_{THP}$ corresponds to the threshold voltage of the second transistor 120.

The threshold voltage of a transistor is the voltage between the control/gate terminal and the input/source terminal of the transistor from which a significant current flows through the conductive channel of the transistor, i.e. a significant current flow occurs when the input voltage applied between the input/source terminal and the control/gate terminal exceeds the threshold voltage of the transistor.

The first and second transistor 110 and 120 are configured to be operated in a first and a second operation state. A respective resistance of the conductive channel of the first and second transistor 110, 120 is higher in the first operation state than in the second operation state of the respective first and second transistor. The first operation state specifies the so-called "non-conductive" state of the transistor. The second operation state specifies the so-called "conductive" state of the transistor.

The control circuit 200 is configured to change the operation state of the first transistor 110, for example a NMOS transistor, when the evaluation circuit 300 detects that the level of the input signal $V_{IN}$ crosses the first threshold value $V_{THN}$. The control circuit 200 is configured to generate the first control signal CS1 such that the first transistor 110 is operated in the first operation state ("non-conductive state"), when the evaluation circuit 300 detects the level of the input signal $V_{IN}$ above the first threshold value $V_{THN}$. The control circuit 200 is further configured to generate the first control signal CS1 such that the first transistor 110 is operated in the second operation state ("conductive state"), when the evaluation circuit 200 detects the level of the input signal $V_{IN}$ below the first threshold value $V_{THN}$.

The control circuit 200 is configured to change the operation state of the second transistor 120, for example a PMOS transistor, when the evaluation circuit 300 detects that the level of the input signal $V_{IN}$ crosses the second threshold value $V_{THP}$. In particular, the control circuit 200 is configured to generate the second control signal CS2 such that the second transistor 120 is operated in the first operation state ("non-conductive state"), when the evaluation circuit 300 detects the level of the input signal $V_{IN}$ below the second threshold value $V_{THP}$. The control circuit 200 is further configured to generate the second control signal CS2 such that the second transistor 120 is operated in the second operation state ("conductive state"), when the evaluation circuit 300 detects the level of the input signal $V_{IN}$ above the second threshold value $V_{THP}$.

The respective first operation state of the first and second transistor 110 and 120 is the respective cut-off state of the first and second transistor. The respective second operation state of the first and second transistor 110 and 120 is a respective linear operation state of the first and second transistor, i.e. the resistance of the electric channel of the transistor shows a linear resistance characteristic.

As shown in the embodiment of the electric circuitry of FIG. 5, the evaluation circuit 300 comprises a first comparator 310 being configured to compare the level of the input signal $V_{IN}$ with the first threshold value $V_{THN}$, and to provide a first comparator output signal S310 indicating the level of the input signal $V_{IN}$ being above or below the first threshold value $V_{THN}$. The evaluation circuit 300 further comprises a second comparator 320 being configured to compare the level of the input signal $V_{IN}$ with the second threshold value $V_{THP}$, and to provide a second comparator output signal S320 indicating the level of the input signal $V_{IN}$ being above or below the second threshold value $V_{THP}$.

The evaluation circuit 300 comprises a first hold circuit 330 to provide a first evaluation signal S330 to the control circuit 200 in response to the first comparator output signal S310. The evaluation circuit 300 further comprises a second hold circuit 340 to provide a second evaluation signal S340 to the control circuit 200 in response to the second comparator output signal S320.

The first hold circuit 330 is configured to provide a holding function so that a state of the first control signal CS1 is kept unchanged even if the evaluation circuit 300 detects an instantaneous change of the value of the input signal $V_{IN}$ swinging above and below the first threshold value $V_{THN}$. In the same way, the second hold circuit 340 is configured to provide a holding function so that a state of the second control signal CS2 is kept unchanged even if the evaluation circuit 300 detects an instantaneous change of the value of the input signal $V_{IN}$ swinging above and below the second threshold value $V_{THP}$.

The control circuit 200 is configured to generate the first control signal CS1 in response to the first evaluation signal S330. As shown in FIG. 5, the control circuit 200 may comprise a logic gate 210 being coupled to a control input terminal C200 to apply an external control signal CS. The external control signal CS serves to operate the transmission gate 100 in a conductive or non-conductive operation mode. The first evaluation signal S330 is applied to the input side of the logic gate 210. As shown in the exemplary embodiment of the electric circuitry 10 of FIG. 5, the first evaluation signal S330 can be applied to the input side of the logic gate 210 via an inverter 230. The output side of the logic gate 210 is connected to the control terminal C110 of the first transistor 110 of the transmission gate 100.

The control circuit 200 further comprises a logic gate 220 being coupled with its output side to the control terminal C120 of the second transistor 120 of the transmission gate 100. An input side of the logic gate 220 is connected to the external control terminal C200 of the control circuit to apply the external control signal CS. The input side of the logic gate 220 is further coupled to the output of the second hold circuit 340 to apply the second evaluation signal S340 to the input side of the logic gate 220. According to the exemplary embodiment of the electric circuitry 10 shown in FIG. 5, the second evaluation signal S340 can be applied to the input side of the logic gate 220 via an inverter 240. When the evaluation circuit 300 detects by the second comparator 320 that the input signal $V_{IN}$ falls below the second threshold value $V_{THP}$, the control circuit 200 generates the second control signal CS2 such that the second transistor 120 is operated in the first operation state ("non-conductive state"). The first transistor 110 is operated in the second operation state ("conductive state"), as long as the input signal $V_{IN}$ is below the first threshold value $V_{THN}$. In this case, the conductive state of the transmission gate 100 is just provided by the first transistor 110.

When the evaluation circuit detects, by the first comparator circuit 310, that the input signal $V_{IN}$ exceeds the first threshold value $V_{THN}$, the control circuit 200 generates the first control signal CS1 to operate the first transistor 110 in the first operation state ("non-conductive state"). The second transistor 120 is operated in the second operation state ("conductive state"), as long as the input signal $V_{IN}$ is above the second threshold value $V_{THP}$. In this case the transmission gate 100 conducts only by means of the second transistor 120.

Figure 1:
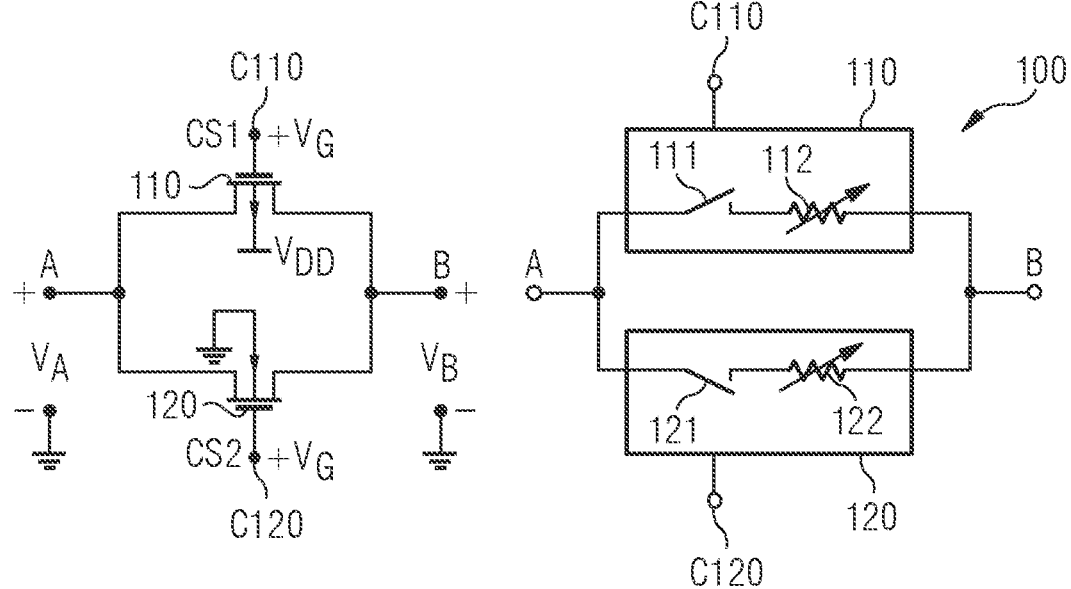
FIG. 1 illustrates an embodiment of a transmission gate to transfer a signal between an input and output terminal of the transmission gate and the corresponding equivalent electric circuit of a transmission gate.
Figure 2:
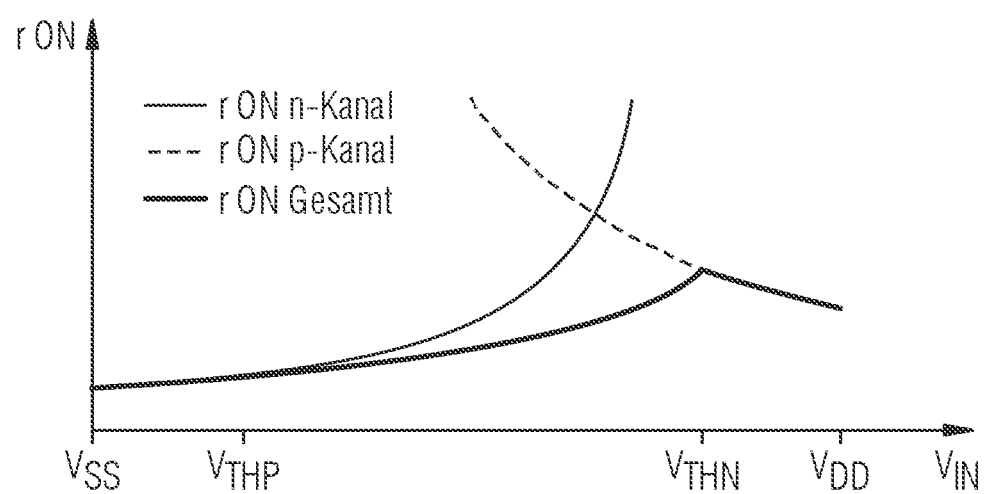
FIG. 2 shows a resistance characteristic of a transmission gate in dependence on an input voltage applied to the transmission gate.
Figure 3:
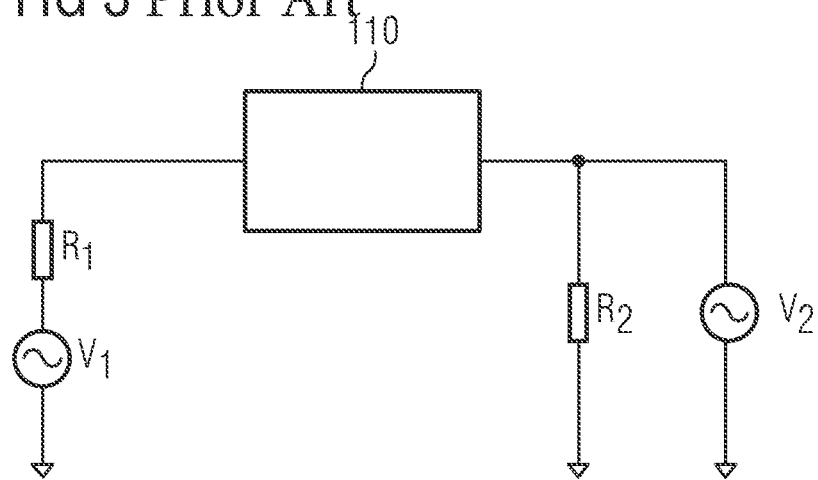
FIG. 3 shows an electric circuit comprising a transmission gate connected between input and output resistors to form a variable potential divider.
Figure 4:
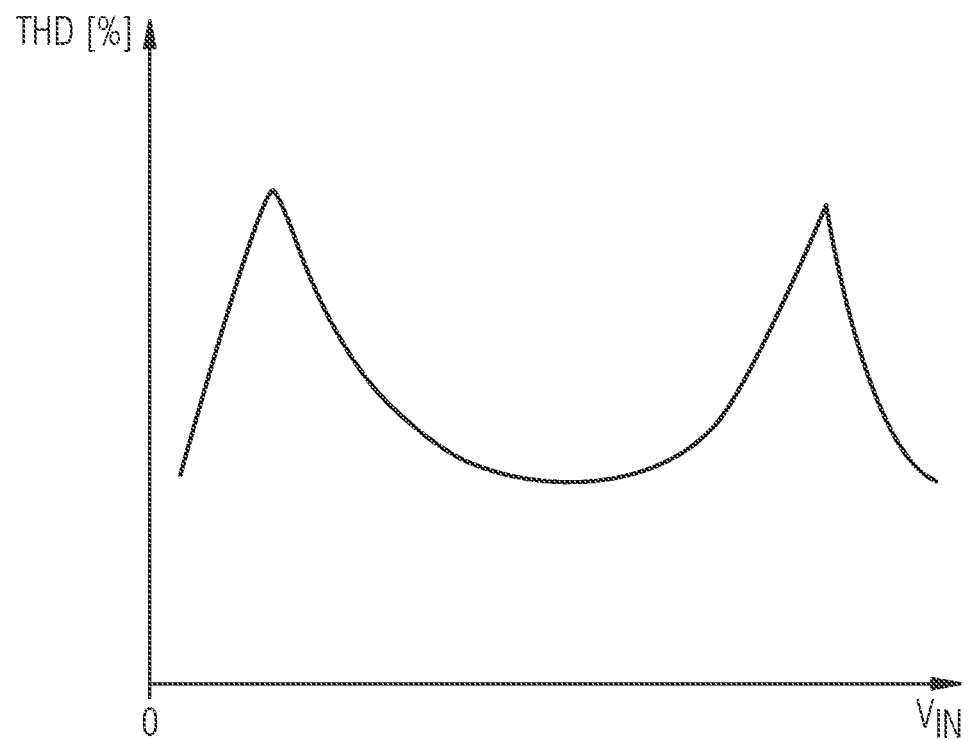
FIG. 4 shows a distortion characteristic of a transfer function of a conventional transmission gate.
Figure 6:
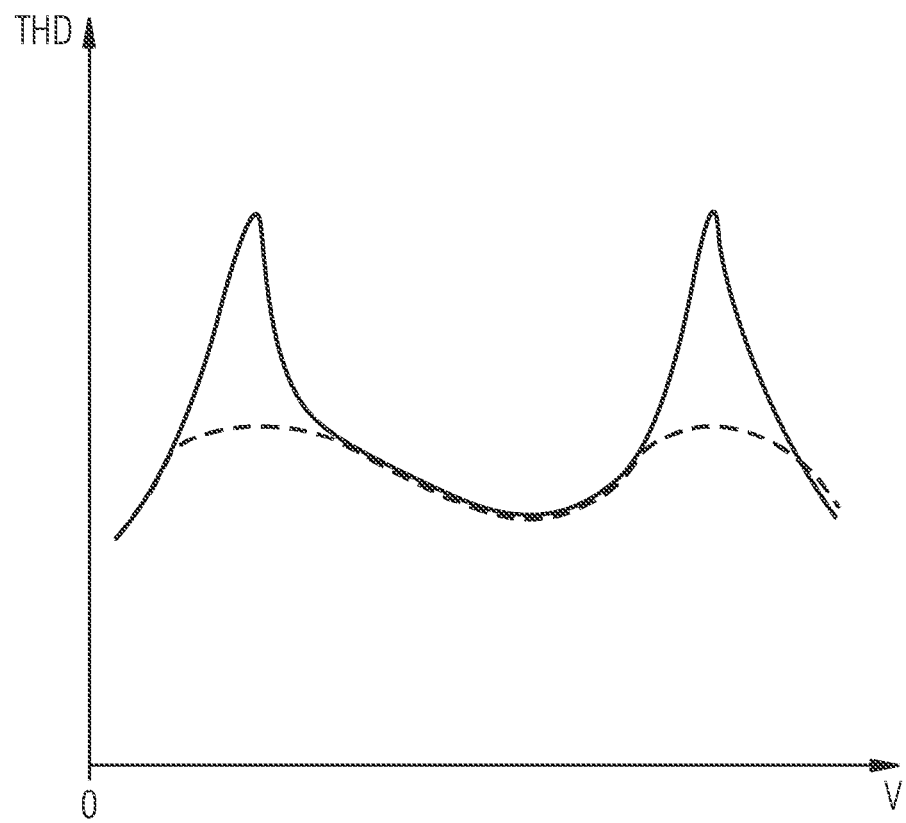
FIG. 6 illustrates a transfer function of a transmission gate having an improved distortion characteristic.

When the evaluation circuit 300 detects by the first and second comparators 310, 330 that the input voltage $V_{IN}$ is between the first threshold value $V_{THN}$ and the second threshold value $V_{THP}$, both of the first and second transistors 110, 120 of the transmission gate 100 are operated in the second operation state ("conductive state"). The configuration of the electric circuitry shown in FIG. 5 enables to prevent a signal swing of the input signal $V_{IN}$ toggling one of the transmission gate transistors 110 and 120 between cut-off and linear operation. FIG. 6 shows the distortion characteristic of the transfer function of the transmission gate 110 of the electric circuitry 10, as shown in FIG. 5. As illustrated in FIG. 6, the peaks of the distortion characteristics shown in FIG. 4 are flattened and thus nearly removed. The area of a transmission gate needed to achieve a specific maximum distortion specification can be reduced. The amount of reduction of the total harmonic distortion THD shown in FIG. 6 is dependent on the specific distortion specification, signal and power supply voltages and CMOS technology used.

Figure 7:
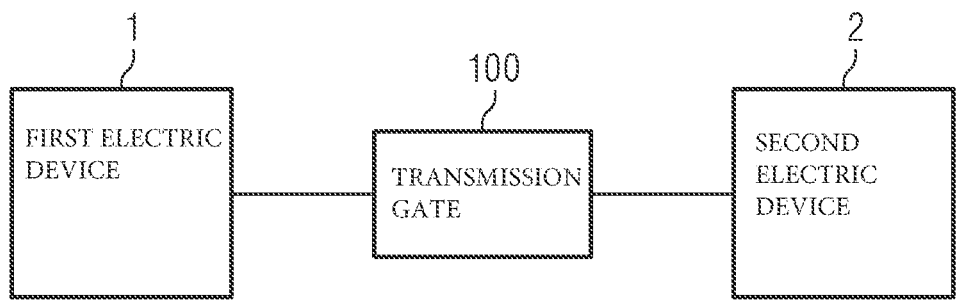
FIG. 7 illustrates a communication system for cable data transmission.

FIG. 7 illustrates a communication system for cable data transmission. The communication system comprises a first electric device 1 to provide the data and a second electric device 2 to receive the data. The first electric device 1 may be configured, for example, as a mobile phone or a computer or a microphone. The second electric device 2 may be configured for signal processing the data received from the first electric device 1. The second electric device 2 may be configured, for example, as an analog-to-digital converter, a recording device, a headset or a sensor device.

The electric circuitry 10 is connected between the first electric device 1 and the second electric device 2. The data is transmitted by the transmission gate 100 of the electric circuitry 10 from the first electric device 1 to the second electric device 2. The electric circuitry 10 can be advantageously used to transmit data between the first electric device 1 and the second electric device 2 with low signal distortion, especially, when the transmission gate is loaded by a finite impedance so that a voltage divider is formed between the transmission gate 100 and an input resistance of the second electric device 2.

The invention claimed is:

1. An electric circuitry for signal transmission, comprising:
a transmission gate having an input node to apply an input signal and an output node to provide an output signal,
a control circuit to control a signal transmission of the transmission gate between the input node and the output node,
an evaluation circuit to evaluate a level of the input signal,
wherein the transmission gate includes a first transistor having an electric conductive channel of a first type of conductivity and a second transistor having an electric conductive channel of a second type of conductivity,
wherein the first transistor has a control terminal to apply a first control signal to control the conductivity of the electric conductive channel of the first transistor,
wherein the second transistor has a control terminal to apply a second control signal to control the conductivity of the electric conductive channel of the second transistor,
wherein the control circuit is configured to generate the first and second control signal in dependence on a voltage level of the input signal to control the conductivity of the first and second transistor, and
wherein the control circuit is configured to change an operation state of the first transistor, when the evaluation circuit detects that the level of the input signal crosses a first threshold value corresponding to a threshold voltage of the first transistor, and to change an operation state of the second transistor, when the evaluation circuit detects that the level of the input signal crosses a second threshold value corresponding to the threshold voltage of the second transistor.

2. The electric circuitry of claim 1,
wherein the first and second transistor are configured to be operated in a first and a second operation state, wherein a respective resistance of the conductive channel of the first and second transistor is higher in the first operation state than in the second operation state of the respective first and second transistor.

3. The electric circuitry of claim 1,
wherein the control circuit is configured to generate the first control signal such that the first transistor is operated in the first operation state, when the evaluation circuit detects the level of the input signal above the first threshold value,
wherein the control circuit is configured to generate the first control signal such that the first transistor is operated in the second operation state, when the evaluation circuit detects the level of the input signal below the first threshold value.

4. The electric circuitry of claim 1,
wherein the control circuit is configured to generate the second control signal such that the second transistor is operated in the first operation state, when the evaluation circuit detects the level of the input signal below the second threshold value,
wherein the control circuit is configured to generate the second control signal such that the second transistor is operated in the second operation state, when the evaluation circuit detects the level of the input signal above the second threshold value.

5. The electric circuitry of claim 2,
wherein the respective first operation state of the first and second transistor is a respective cutoff state of the first and second transistor,
wherein the respective second operation state of the first and second transistor is a respective linear operation state of the first and second transistor.

6. The electric circuitry of claim 1,
wherein the evaluation circuit comprises a first comparator being configured to compare the level of the input signal with the first threshold value and to provide a first comparator output signal indicating the level of the input signal being above or below the first threshold value,
wherein the evaluation circuit comprises a second comparator being configured to compare the level of the input signal with the second threshold value and to provide a second comparator output signal indicating the level of the input signal being above or below the second threshold value.

7. The electric circuitry of claim 6, comprising:
wherein the evaluation circuit comprises a first hold circuit to provide a first evaluation signal to the control circuit in response to the first comparator output signal,
wherein the control circuit is configured to generate the first control signal in response to the first evaluation signal,
wherein the evaluation circuit comprises a second hold circuit to provide a second evaluation signal to the control circuit in response to the second comparator output signal,
wherein the control circuit is configured to generate the second control signal in response to the second evaluation signal.

8. The electric circuitry of claim 7,
wherein the first hold circuit is configured to provide a holding function so that a state of the first control signal is kept unchanged, even if the evaluation circuit detects an instantaneous change of the value of the input signal swinging above and below the first threshold value, wherein the second hold circuit is configured to provide a holding function so that a state of the second control signal is kept unchanged even if the evaluation circuit detects an instantaneous change of the value of the input signal swinging above and below the second threshold value.

9. The electric circuitry of claim 1,
wherein the electric conductive channel of the first transistor has a conductivity of an n-type,
wherein the electric conductive channel of the second transistor has a conductivity of a p-type.

10. A communication system for cable data transmission, comprising:
a first electric device to provide the data and a second electric device to receive the data,
an electric circuitry for signal transmission according to claim 1,
wherein the electric circuitry is connected between the first electric device (1) and the second electric device,
wherein the data is transmitted by the transmission gate of the electric circuitry from the first electric device to the second electric device.

11. The communication system of claim 10,
wherein the first electric device is configured as a mobile phone or a computer or a microphone,
wherein the second electric device is configured for signal processing the data received from the first electric device.

\* \* \* \* \*